(12) United States Patent
Takeda et al.

(10) Patent No.: US 8,174,355 B2
(45) Date of Patent: May 8, 2012

(54) SEMICONDUCTOR DEVICE AND METHOD FOR MANUFACTURING THE SAME

(75) Inventors: Kenichi Takeda, Tokorozawa (JP); Tsuyoshi Fujiwara, Hamura (JP); Toshinori Imai, Ome (JP)

(73) Assignee: Hitachi, Ltd., Tokyo (JP)

( * ) Notice: Subject to any disclaimer, the term of this patent is extended or adjusted under 35 U.S.C. 154(b) by 947 days.

(21) Appl. No.: 12/167,606

(22) Filed: Jul. 3, 2008

(65) Prior Publication Data

US 2009/0015369 A1    Jan. 15, 2009

(30) Foreign Application Priority Data

Jul. 13, 2007   (JP) .................................. 2007-184614

(51) Int. Cl.
*H01C 1/012* (2006.01)
(52) U.S. Cl. .......................... 338/307; 338/309; 257/380
(58) Field of Classification Search .......... 338/307–309; 257/380, 359, 379
See application file for complete search history.

(56) References Cited

U.S. PATENT DOCUMENTS

| | | | | |
|---|---|---|---|---|
| 4,766,411 A | * | 8/1988 | Prieto et al. | 338/306 |
| 5,585,776 A | * | 12/1996 | Anderson et al. | 338/308 |
| 6,759,729 B1 | * | 7/2004 | Racanelli et al. | 257/536 |
| 6,888,763 B1 | * | 5/2005 | Guo | 365/189.11 |
| 7,217,981 B2 | * | 5/2007 | Coolbaugh et al. | 257/380 |

FOREIGN PATENT DOCUMENTS

| | | |
|---|---|---|
| JP | 54-083786 A | 7/1979 |
| JP | 56-64405 A | 6/1981 |

* cited by examiner

*Primary Examiner* — Kyung Lee
(74) *Attorney, Agent, or Firm* — Miles & Stockbridge P.C.

(57) ABSTRACT

A resistor R1 formed by forming a first resistor layer 5a of 20 nm thickness including a tantalum nitride film at a concentration of nitrogen of less than 30 at % and a second resistor layer of 5 nm thickness including a tantalum nitride film at a concentration of nitrogen of 30 at % or more successively by a reactive DC sputtering method using tantalum as a sputtering target material and using a gas mixture of argon and nitrogen as a sputtering gas, and then fabricating the first and the second resistor layers, in which the resistance change ratio of the resistor can be suppressed to less than 1% even when a thermal load is applied in the interconnection step, by the provision of the upper region at a concentration of nitrogen of 30 at % or more.

5 Claims, 14 Drawing Sheets

5a: FIRST RESISTOR LAYER
5b: SECOND RESISTOR LAYER

SEMICONDUCTOR DEVICE AND METHOD FOR MANUFACTURING THE SAME

CLAIM OF PRIORITY

The present application claims priority from Japanese patent application JP 2007-184614 filed on Jul. 13, 2007, the content of which is hereby incorporated by reference into this application.

FIELD OF THE INVENTION

The present invention relates to a semiconductor device and a technique for manufacturing the same and more particularly to a technique effective for application to a semiconductor device having a resistor composed of a metal film and a method of manufacturing the same.

BACKGROUND OF THE INVENTION

In a semiconductor device handling analog signals, passive elements such as a capacitor, a resistor, and an inductor are important constituent elements for integrated circuits. Since such passive elements are difficult to be fabricated into a semiconductor chip, they have been mounted as external parts on a packaging substrate. However, since requirement for increasing the operation speed of a system and space saving have become increased in recent years, it has been attempted to incorporate passive elements into a semiconductor chip.

As a method of forming a resistor in the inside of a semiconductor chip, while several methods have been proposed, a method of fabricating a poly-silicon film formed by CVD (Chemical Vapor Deposition) method into a desired pattern and using the same as a resistor has been adopted generally. For example, JP-A-Sho 54(1979)-083786 discloses a method of forming a resistor using a poly-silicon film.

Further, a method of using a metal film capable of low temperature formation as a material for the resistor has been proposed. Generally, a metal film can provide a film of high quality also by using a sputtering method or a plasma CVD method at a low deposition temperature. Accordingly, since the resistor can be formed even after forming an interconnection using aluminum or copper, it is possible to provide a resistor with low parasitic capacitance and excellent high frequency property. For example, JP-A-Sho 56(1981)-064405, discloses a method of forming a resistor using a metal film.

SUMMARY OF THE INVENTION

However, various technical subjects to be described later are present for a resistor composed of a poly-silicon film.

Since the poly-silicon film as the material for the resistor is formed generally by a low pressure CVD method in which the temperature upon film formation is about 700° C., it is necessary to form a resistor before forming an interconnection composed of a metal film (for example, aluminum or copper). Accordingly, since the resistor is formed at a position nearer to a substrate than the interconnection composed of a metal film, this results in a problem of generating parasitic capacitance between the substrate and the resistor to deteriorate high frequency characteristics.

Further, various technical subjects to be described below are present in a resistor composed of a metal film.

Since the resistor composed of a metal film can be formed after forming an interconnection composed of a metal film, the parasitic capacitance of the resistor can be decreased.

Further, in a resistor formed by stacking, for example, a tantalum film having a positive TCR (Temperature Coefficient of Resistance) and a tantalum nitride film having a negative TCR, TCR can be reduced substantially to 0. However, the resistor including the metal film involves a problem that the resistance value fluctuates in accordance with the thermal hysteresis in the subsequent interconnection step. Specifically, when an interconnection is formed after forming the resistor, the resistance value of the resistor increases and the resistance value further increases along with increase in the number of interconnection layers; therefore, this results in remarkable degradation of analog characteristics in an integrated circuit handling analog signals. When the present inventors have observed the structure and analyzed the composition of a resistor increased with the resistance value, it has been found that the ends of the upper surface and the lower surface of the resistor are oxidized to form a tantalum oxide film and the thickness of the tantalum oxide film increases more as the number of the interconnection layers increases. It is considered that the tantalum oxide film is formed upon formation of the interconnection by the reaction of oxygen or moisture content contained in an interlayer dielectric film covering the periphery of the resistor with a tantalum film or a tantalum nitride film constituting the resistor. Accordingly, in the resistor composed of the metal film, while the parasitic capacitance can be decreased, it results in a problem that the resistance value increases by the subsequent heat treatment and no desired resistance value can be obtained.

The present invention intends to provide a technique capable of obtaining a semiconductor device having a resistor of low parasitic capacitance and with less fluctuation of a resistance value by a heat treatment.

The foregoing and other objects and novel features of the present invention will become apparent based on the descriptions of the present specification and appended drawings.

Outline of typical inventions among those disclosed in the present application is to be described simply as below.

The semiconductor device of the invention includes a resistor composed of nitrogen and tantalum as main constituent elements above the main surface of a substrate, and an upper region for 5 to 10 nm thickness of the resistor contains nitrogen at 30 at % or higher concentration and comprises an amorphous phase and a TaN crystal phase as a main constituent phase.

A method of manufacturing a semiconductor device according to an aspect of the invention includes a step of forming a first interconnection above the main surface of a substrate, a step of forming an interlayer dielectric film for covering the first interconnection above the main surface of the substrate, a step of forming a first resistor layer on the interlayer dielectric film by a sputtering method using tantalum as a target material and using a first gas mixture containing a nitrogen gas, successively forming a second resistor layer on the first resistor layer by using a second gas mixture at a higher ratio of the nitrogen gas than the first gas mixture, thereby forming a resistor layer composed of nitrogen and tantalum as main constituent elements, and including the first resistor layer containing a first concentration of nitrogen and the second resistor layer containing a second concentration of nitrogen higher than that of the first concentration of nitrogen and a step of fabricating the resistor layer thereby forming the resistor.

A method of manufacturing a semiconductor device according to an aspect of the invention includes a step of forming a first interconnection above the main surface of a substrate, a step of forming an interlayer dielectric film for covering the first interconnection above the main surface of a substrate, a step of forming a first resistor layer containing a first concentration of nitrogen over the interlayer dielectric film, a step of exposing the surface of the first resistor layer to an atmosphere containing nitrogen atoms to introduce nitrogen atoms in a upper region of the first resistor layer and forming a second resistor layer containing a second concentration of nitrogen higher than that of the concentration of nitrogen of the first concentration of nitrogen, thereby forming a resistor layer composed of nitrogen and tantalum as main constituent elements and including the first resistor layer and the second resistor layer and the step of fabricating the resistor layer thereby forming a resistor.

The effects obtained by typical inventions among those disclosed in the present application are described simply as below.

Since a resistor composed of nitrogen and tantalum as the main constituent elements and capable of suppressing the resistance change ratio to less than 1% even when a thermal load in the interconnection step is applied is obtained, a semiconductor device having a resistor of low parasitic capacitance and with less fluctuation of resistance value due to heat treatment can be attained.

DETAILED DESCRIPTION OF THE PREFERRED EMBODIMENTS

Figure 1:
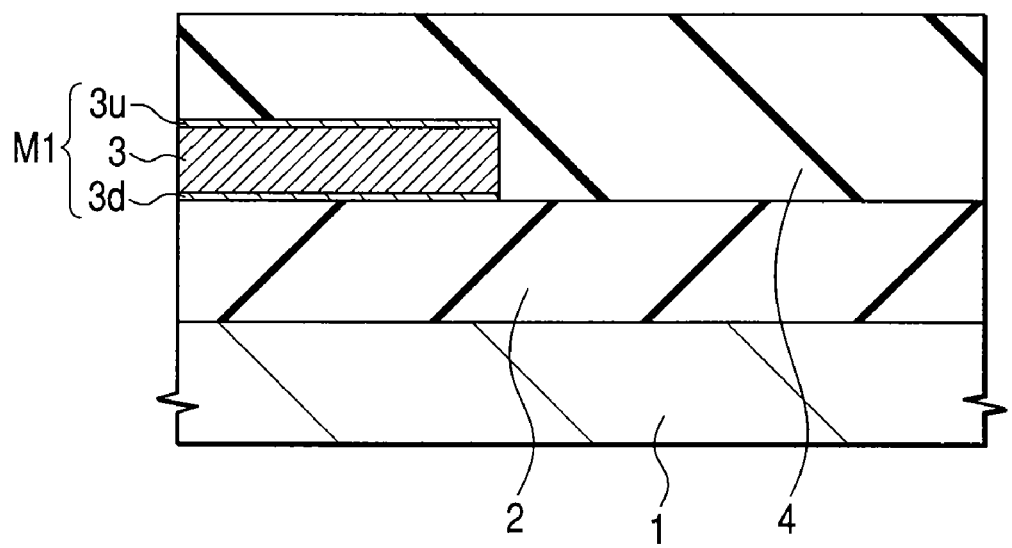
FIG. 1 is a cross sectional view for a main portion showing a method of manufacturing a resistor according to a first embodiment of the invention.

In the embodiments, although descriptions will be made in a plurality of divided sections or embodiments if necessary for convenience's sake, the sections or embodiments are not independent from each other, but are in such a relation that one is a modification example, details or complementary description of a part or whole of the other, unless otherwise indicated specifically.

Further, in the embodiments, when reference is made to number of constituent elements or the like (including the number, value, amount and range), the number of elements is not limited to the specified number, but can be not greater than or less than the specified number, unless otherwise indicated specifically, or in the case it is principally apparent that the number is restricted to the specified number. Moreover, in the embodiments, it is needless to say that the constituent elements (including constituent steps) are not always essential, unless otherwise specified, or in the case where it is principally apparent that they are essential. Similarly, in the embodiments, when a shape of a constituent element or the like, a positional relationship, or the like is referred to, it also includes shapes substantially approximate to or similar with the shape or the like except for a case indicated specifically, a case that it is considered that a shape should be apparently included in view of principle, or the like.

Further, in the embodiments, when "wafer" is referred to, this mainly means Si (silicon) single crystal wafer but also means an SOI (Silicon On Insulator) wafer, a dielectric film substrate for forming an integrating circuit thereon, etc. The shape is not restricted only to a circular shape or substantially circular shape but also includes a square shape, rectangular shape, etc.

Further, throughout the drawings for displaying the preferred embodiments, those having identical functions carry identical reference numerals and repetitive descriptions are to be omitted in principle. Preferred embodiments of the invention are to be described specifically.

First Embodiment

Figure 2:
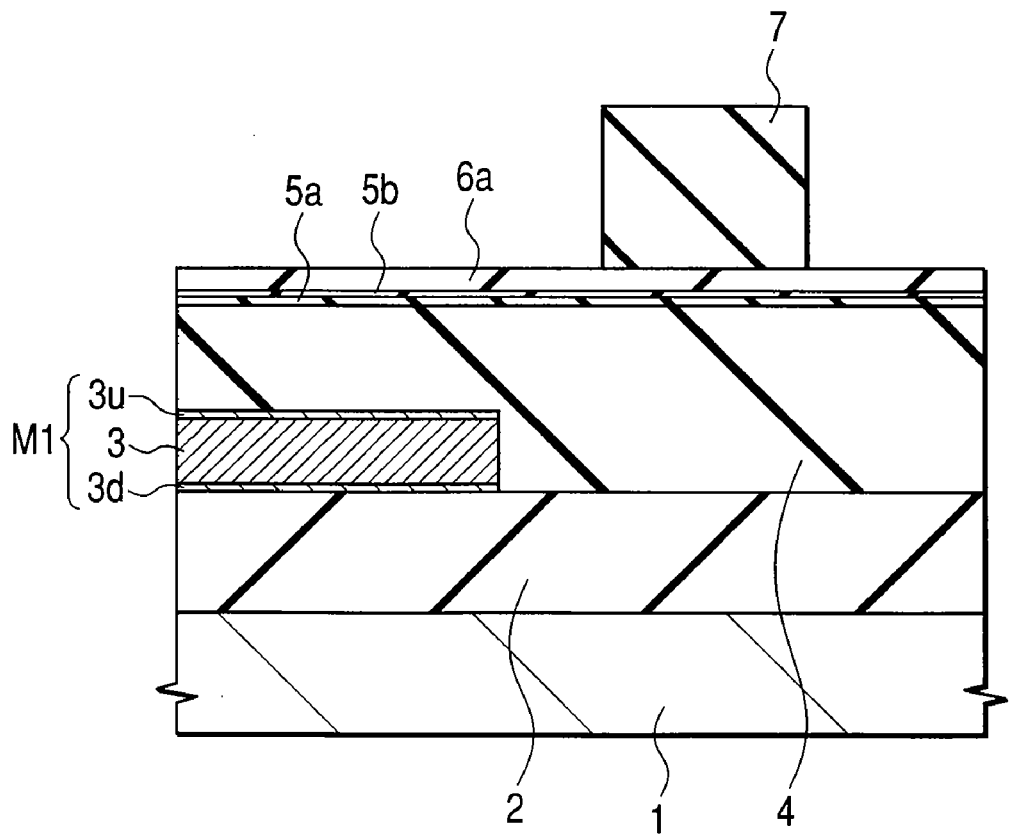
FIG. 2 is a cross sectional view for a main portion at a part identical with that in FIG. 1 during a manufacturing step of the resistor succeeding to FIG. 1.
Figure 9:
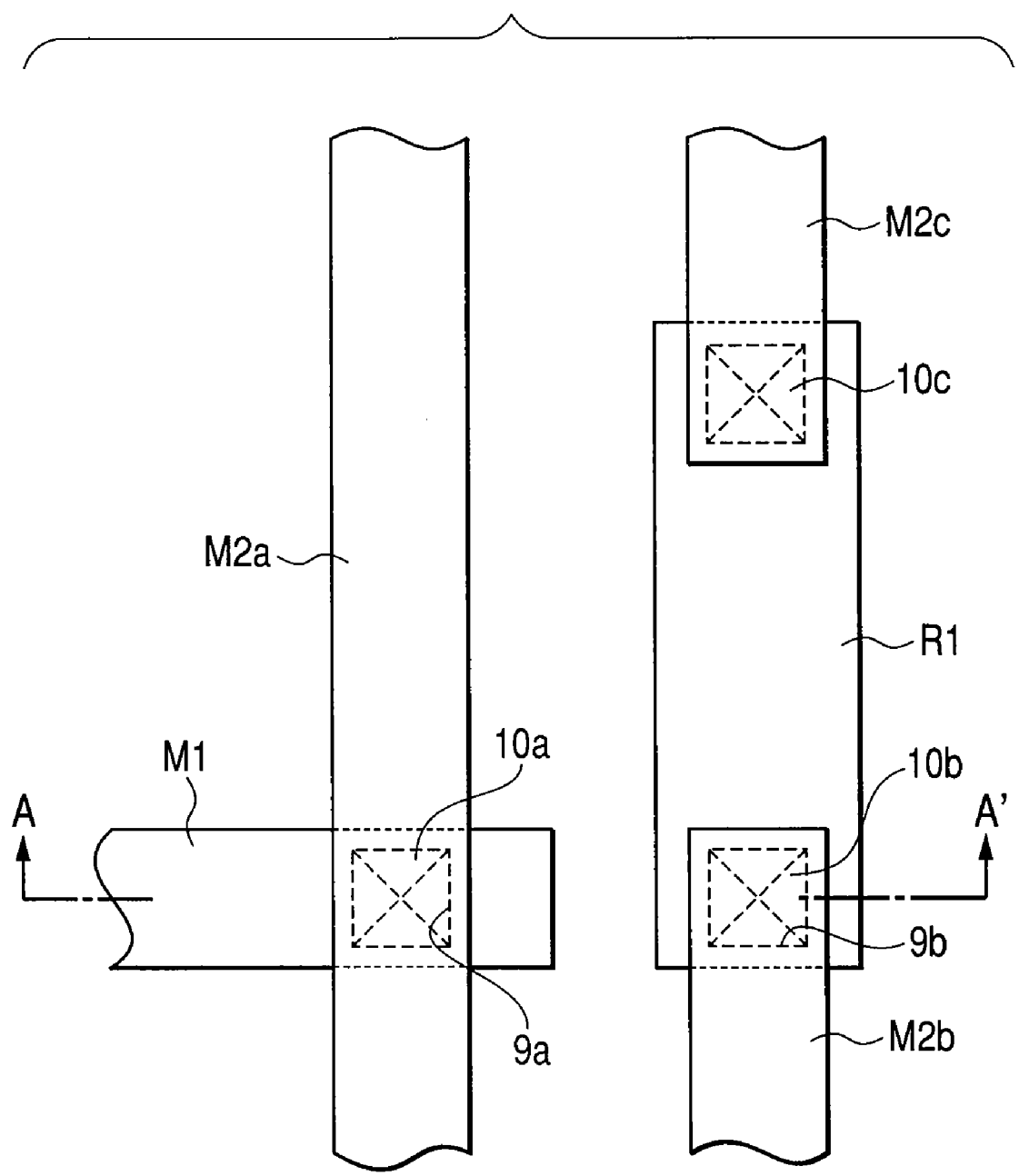
FIG. 9 is a planar layout view of the resistor according to the first embodiment of the invention.
Figure 10:
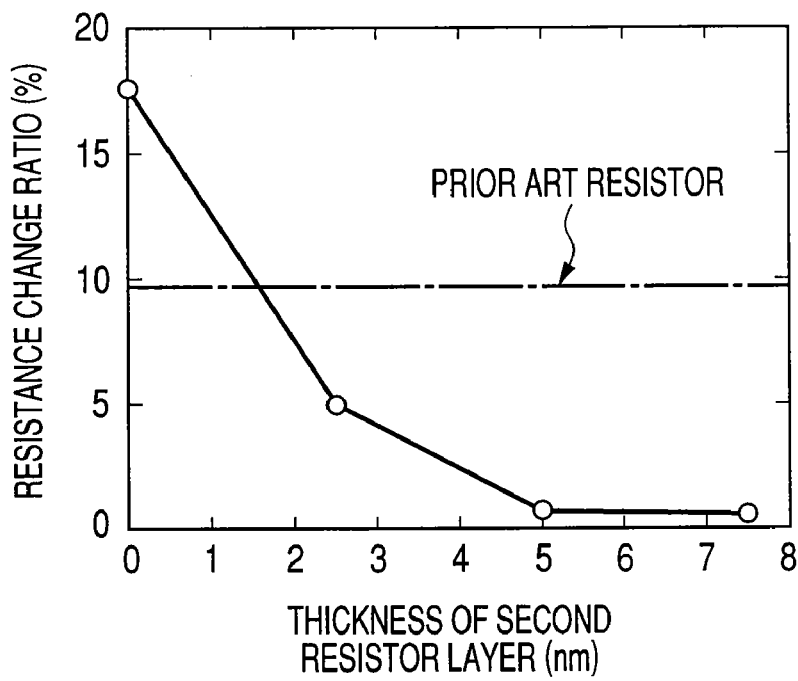
FIG. 10 is a graph showing a relation between the resistance change ratio and the thickness of a second resistor layer of the resistor according to the first embodiment of the invention.
Figure 11:
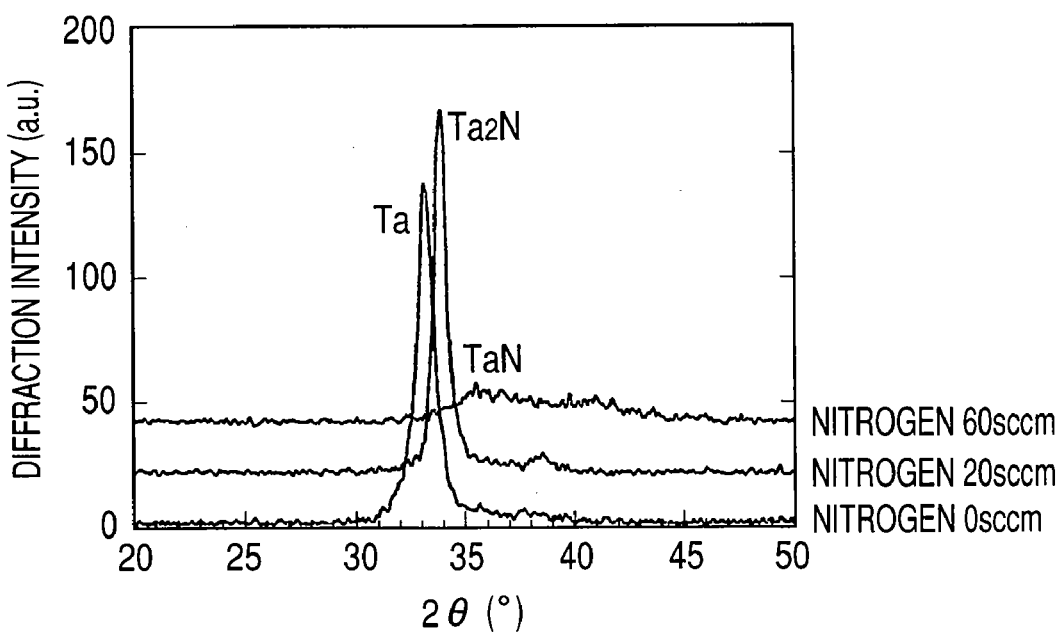
FIG. 11 is an analysis chart showing an X-ray diffraction pattern of a tantalum nitride film formed by a sputtering method while varying a nitrogen flow rate according to the first embodiment of the invention.

An example of a method of forming a resistor according to a first embodiment of the invention is to be described with reference to FIG. 1 to FIG. 11 in the order of steps. FIG. 1 and FIG. 2 are cross sectional views for a main portion showing a method of manufacturing a resistor, FIG. 3 is a graph showing a sputtering sequence upon forming a resistor layer, FIG. 4 is a graph showing the dependence of a resistivity or temperature coefficient of resistance on a nitrogen gas flow rate of a tantalum nitride film formed by a reactive DC sputtering method, FIG. 5 to FIG. 8 are cross sectional views for a main portion showing a manufacturing method of the resistor, FIG. 9 is a planar layout view of the resistor, FIG. 10 is a graph showing a relation between the resistance change ratio and the thickness of the second resistor layer of the resistor, and FIG. 11 is an analysis view showing X-diffraction pattern of a tantalum nitride film formed by sputtering method while varying a nitrogen flow rate.

At first, as shown in FIG. 1, a first interlayer dielectric film 2 composed of a silicon oxide film is formed on a main surface of a substrate 1 formed with a semiconductor device (not illustrated). The silicon oxide film is formed, for example, by a plasma CVD method and the thickness thereof is, for example, 1 μm. Successively, after forming a titanium nitride film 3d, an aluminum alloy film 3, and a titanium nitride film 3u successively by a sputtering method, the multi-level film is fabricated by a photolithographic method and a dry etching method to form a first interconnection W1 composed of the titanium nitride films 3d, 3u and the aluminum alloy film 3. The thickness for each of the titanium nitride films 3d, 3u is, for example, 50 nm, and the thickness of the aluminum alloy film 3 is, for example, 400 nm. Successively, after forming a silicon oxide film, for example, of 1.5 μm thickness for covering the first interconnection M1 above the main surface of the substrate 1, for example, by a plasma CVD method, the surface of the silicon oxide film is polished by a CMP (Chemical Mechanical Polishing) method to form a second interlayer dielectric film 4 composed of the silicon oxide film.

Then, as shown in FIG. 2, a first resistor layer 5a composed of a so-called tantalum nitride film and a second resistor layer 5b composed of the tantalum nitride film each composed of nitrogen and tantalum as main constituent elements are formed successively by a reactive DC sputtering method using tantalum as a sputtering target material and a gas mixture of argon and nitrogen as a sputtering gas. While the first resistor layer 5a and the second resistor layer 5b are formed continuously in an identical deposition chamber, forming conditions are different from each other as will be described later. The thickness of the tantalum nitride film constituting the first resistor layer 5a is, for example, 20 nm, and the thickness of the tantalum nitride film constituting the second resistor layer 5b is, for example, 5 nm. Successively, a first dielectric film 6a composed of a silicon nitride film is formed by a plasma CVD method using ammonia and monosilan gas. The thickness of the first dielectric film 6a is, for example, 100 nm. Then, a first photoresist pattern 7 composed of a photosensitive organic film is formed in a desired region on the first dielectric film 6a by using a photolithographic method.

Figure 3:
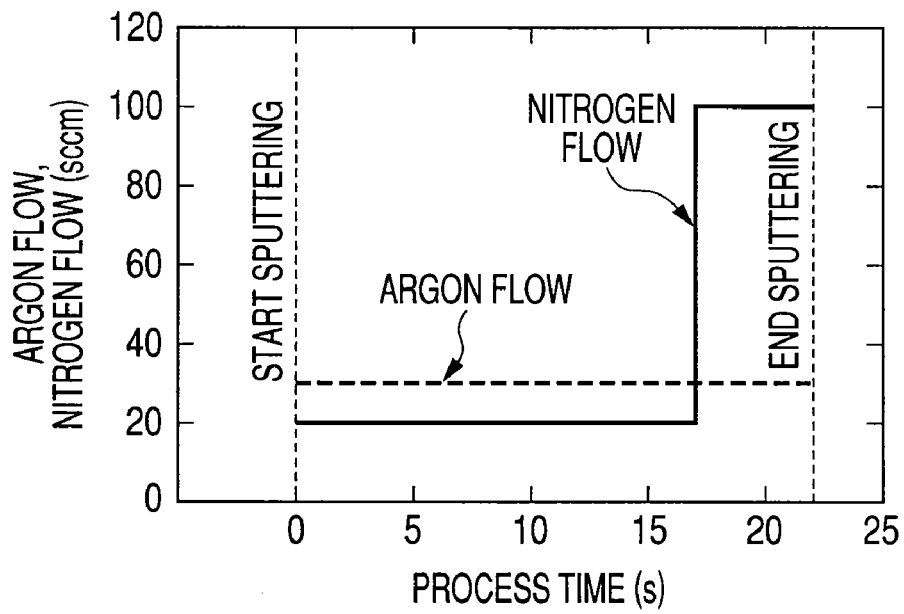
FIG. 3 is a graph showing a sputtering sequence upon forming a resistor layer according to the first embodiment of the invention.
Figure 4:
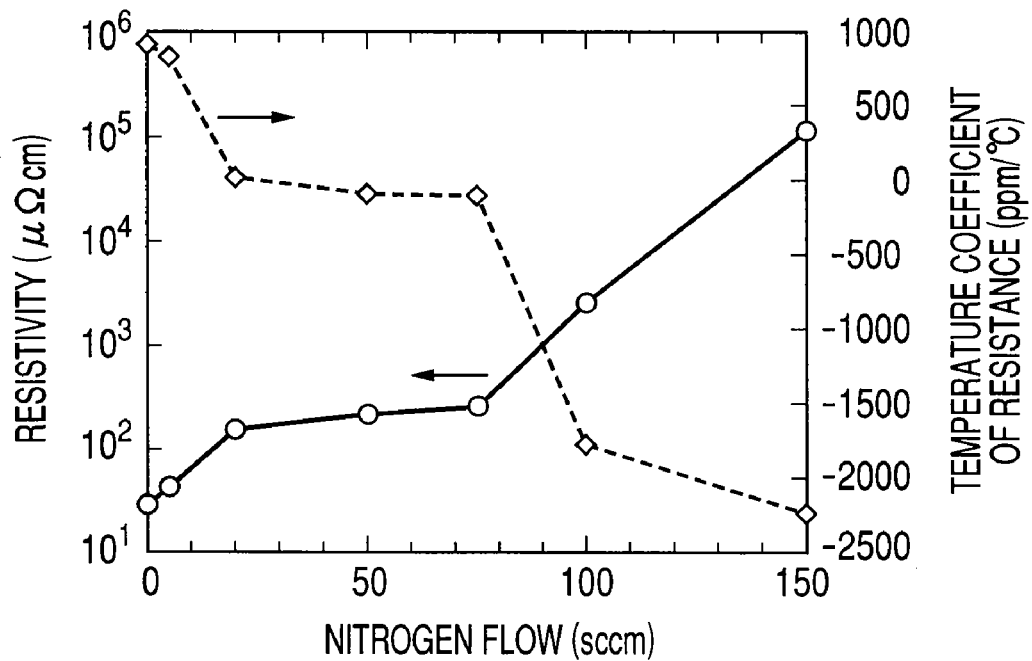
FIG. 4 is a graph showing the dependence of a resistivity or a temperature coefficient of resistance on a nitrogen flow rate of a tantalum nitride film formed by reactive DC sputtering method according to the first embodiment of the invention.

FIG. 3 shows an example of a sputtering sequence upon forming the first and the second resistor layers 5a, 5b. In FIG. 3, the ordinate represents a flow rate of argon or nitrogen and the abscissa represents a process time. The argon flow rate during sputtering is constant and fixed, for example, to 30 sccm (1 sccm is a flow rate of 1 cc per min under standard reference atmosphere condition). At first, the first resistor layer 5a is formed by keeping the nitrogen flow rate during sputtering, for example, at 20 sccm for 17 sec. Then, the second resistor layer 5b is formed by keeping the nitrogen flow rate, for example, at 100 sccm for 5 sec. The charged electric power to a target is at a constant value, for example, of 12 kW.

In the first embodiment, conditions for forming the first and the second resistor layers 5a, 5b are set as: 20 sccm for the nitrogen flow rate upon forming the first resistor layer 5a, and 100 sccm for the nitrogen flow rate upon forming the second resistor layer 5b, and the reason is to be described below with reference to FIG. 4.

In FIG. 4, the ordinate represents a resistivity or a temperature coefficient of resistance of the tantalum nitride film formed by a reactive DC sputtering method and the abscissa represents a nitrogen flow rate. The argon flow rate is 30 sccm and the charged electric power is 12 kW. As shown in FIG. 4, as the nitrogen flow rate increases, while the resistivity of the tantalum nitride film increases, the temperature coefficient of resistance changes from positive to negative. Then, as the condition for forming the first resistor layer 5a, a nitrogen flow rate at 20 sccm where the temperature coefficient of resistance decreases to substantially 0 was adopted. Further, as the condition for forming the second resistor layer 5b, a nitrogen flow rate at 100 sccm was adopted where the temperature coefficient of resistance decreased to −1800 ppm/° C. but the resistivity increased greatly to 2500 μΩcm.

Figure 5:
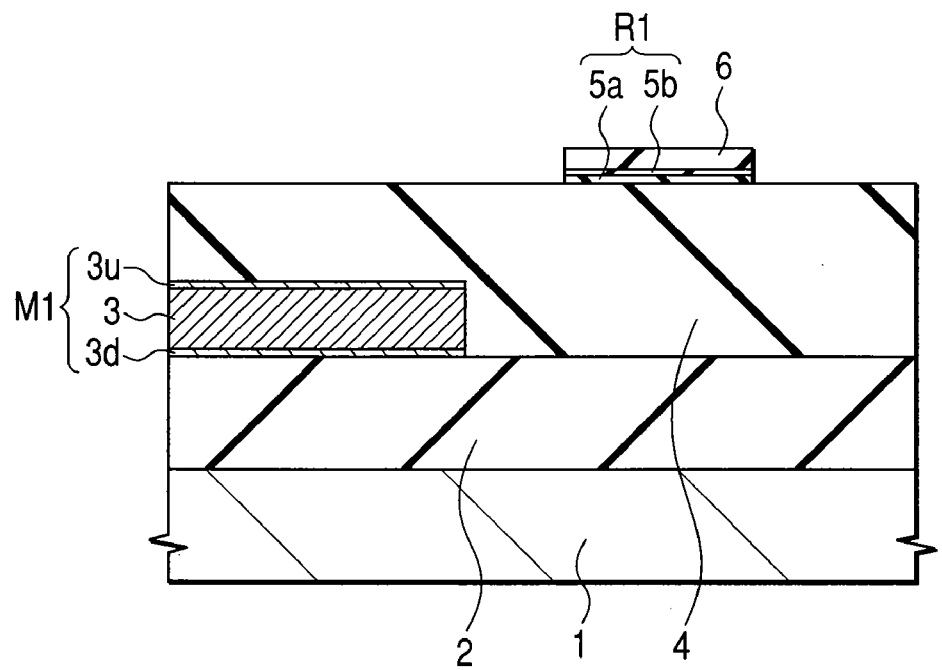
FIG. 5 is a cross sectional view for a main portion of a part identical with that in FIG. 1 during a manufacturing step of the resistor succeeding to FIG. 2.

Then, as shown in FIG. 5, a first dielectric film 6a is fabricated by a dry etching method using the first resist pattern 7 as a mask to form a first hard mask 6 composed of a non-photosensitive dielectric material. Further, after removing the first resist pattern 7, the second resistor layer 5b and the first resistor layer 5a are successively fabricated by a dry etching method using the first hard mask 6 as a mask to form a resistor R1 composed of the first and the second resistor layers 5a, 5b.

Figure 6:
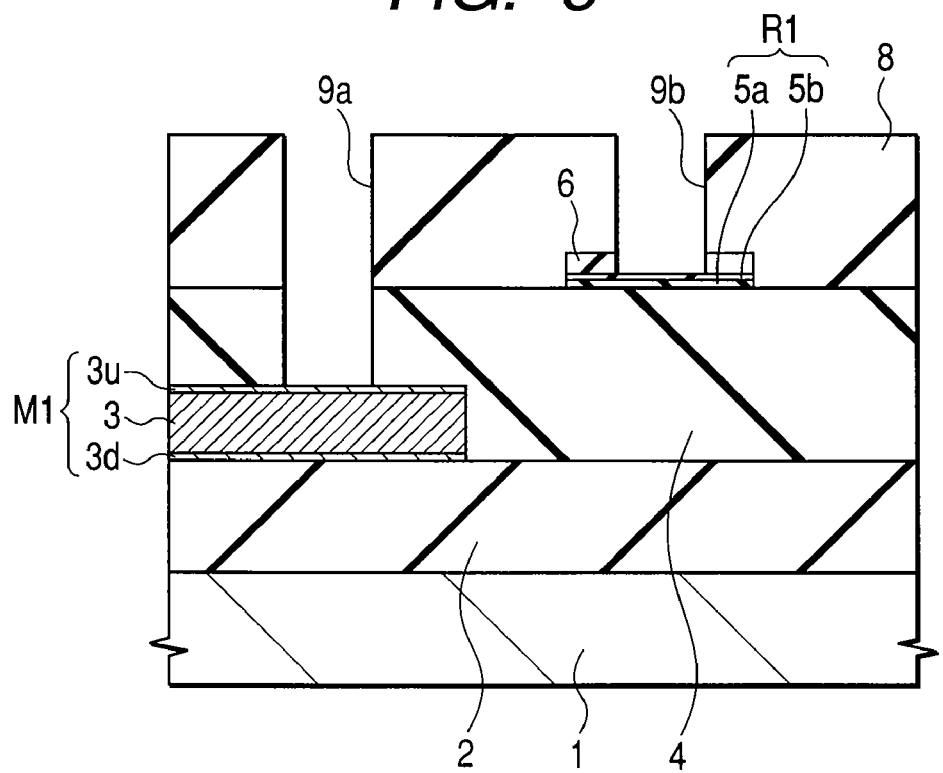
FIG. 6 is a cross sectional view for a main portion of a part identical with that in FIG. 1 during a manufacturing step of the resistor succeeding to FIG. 5.

Then, as shown in FIG. 6, a third interlayer dielectric film 8 composed of a silicon oxide film is formed above the main surface of the substrate 1. The silicon oxide film is formed, for example, by a plasma CVD method and the thickness thereof is 1 μm. Successively, first and second connection holes 9a, 9b are formed to desired regions of the third interlayer dielectric film 8 by a photolithographic method and a dry etching method. In this case, the first connection hole 9a is formed so as to expose a portion of the surface of the first interconnection M1, while the second connection hole 9b is formed so as to expose a portion of the surface of the second resistor layer 5b constituting the upper portion of the resistor R1.

Figure 7:
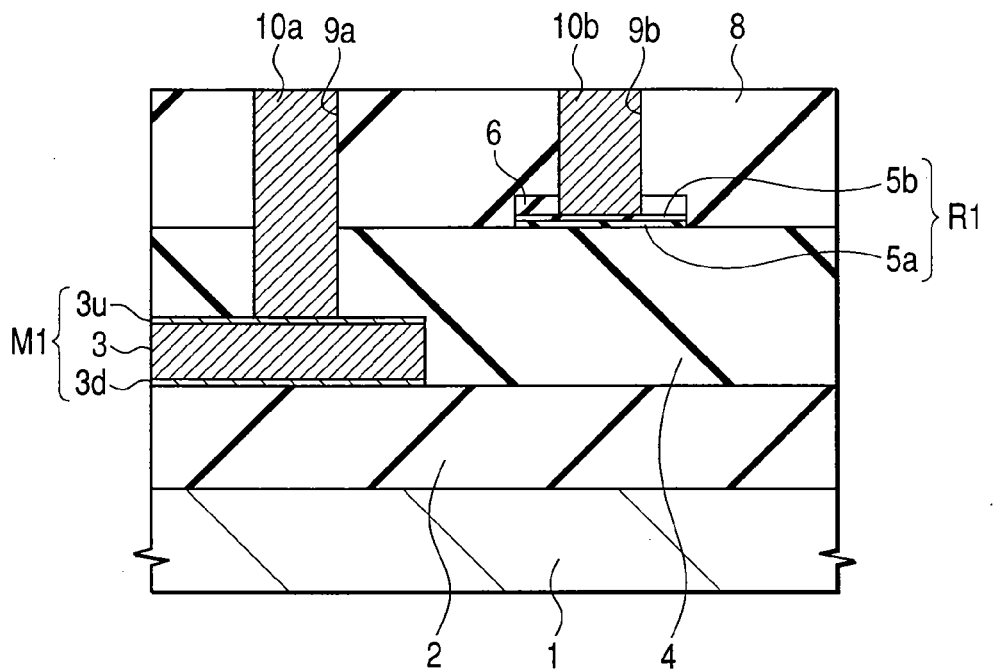
FIG. 7 is a cross sectional view for a main portion of a part identical with that in FIG. 1 during a manufacturing step of the resistor succeeding to FIG. 6.

Then, as shown in FIG. 7, after forming a metal film, for example, a tungsten film above the main surface of the substrate 1 by a sputtering method and a CVD method, the metal film is polished by a CMP method to form a first plug 10a in the inside of the first connection hole 9a and the second plug 10b in the inside of the second connection hole 9b.

Figure 8:
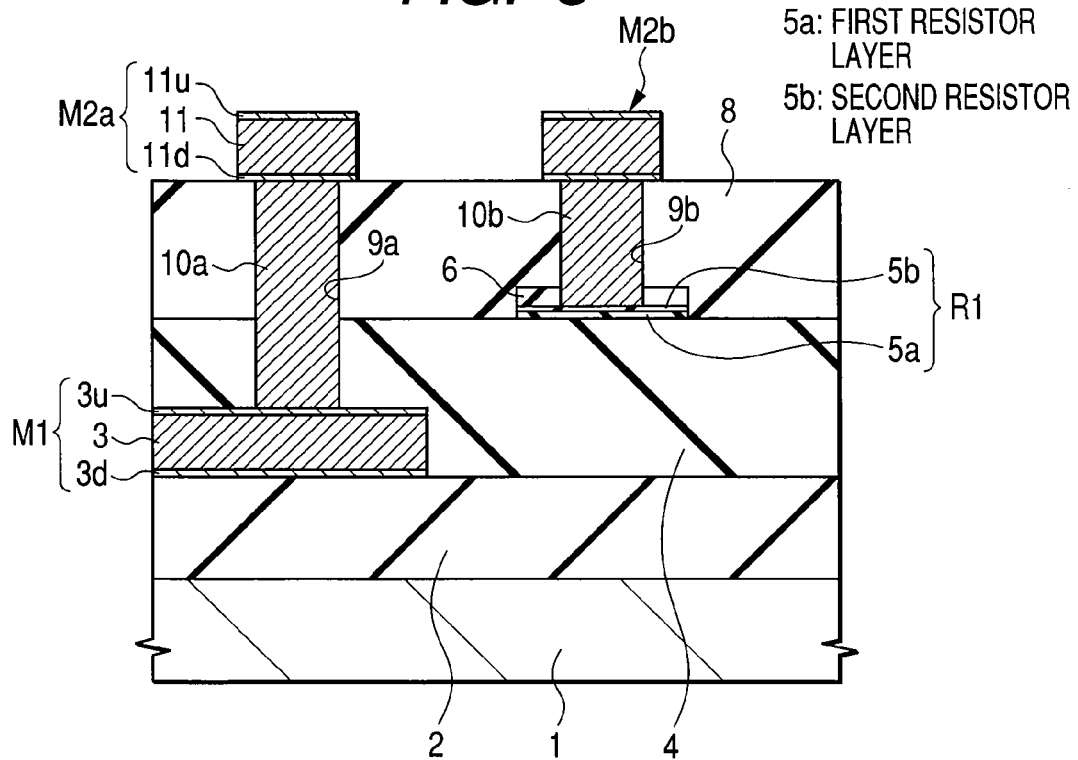
FIG. 8 is a cross sectional view for a main portion of a part identical with that in FIG. 1 during a manufacturing step of the resistor succeeding to FIG. 7.

Then, as shown in FIG. 8, after forming a titanium nitride film 11d, an aluminum alloy film 11, and a titanium nitride film 11u successively by a sputtering method above the main surface of the substrate 1, the multi-level film is fabricated by a photolithographic method and a dry etching method to form second interconnections M2a, M2b composed of titanium nitride films 11d, 11u and an aluminum alloy film 11. The thickness of each of the titanium nitride films 11d, 11u is, for example, 50 nm and the thickness of the aluminum alloy film 11 is, for example, 400 nm.

FIG. 9 shows a planar layout view of the resistor. Cross sectional views shown in FIG. 1, FIG. 2 and FIG. 5 to FIG. 8 show cross sections along line A-A' in FIG. 9.

As shown in FIG. 9, a lead electrode composed of a second plug 10b formed in contact with the second resistor layer 5b and the second interconnection M2b is formed to one end of the resistor R1, while a lead electrode composed of a third plug 10c formed in contact with the second resistor layer 5b and the second interconnection M2c is formed at the other end of the resistor R1. The third plug 10c is a plug formed in the same manner as the second plug 10b, and the second interconnection M2c is an interconnection formed in the same manner as the second interconnection M2b. Further, in adjacent with the resistor R1, an interconnection constituted with the first interconnection M1, the first plug 10a, and the second interconnection M2a is laid.

Then, the performance of the resistor R1 formed by the manufacturing method described above is to be described. At first, in the first embodiment, the thickness of the resistor R1 and the second resistor layer 5b is made to 5 nm and the effect thereof is to be described.

The resistance change ratio in a case of changing the thickness of the second resistor layer 5b of the resistor R1 according to the first embodiment was examined. FIG. 10 is a graph showing the relation between the resistance change ratio and the thickness of the second resistor layer of the resistor. In the graph, the resistance change ratio of a resistor composed of a resistor layer constituted with a tantalum nitride film with the concentration of nitrogen being constant (hereinafter referred to as an existent resistor) is shown by a dotted broken line. In the existent resistor, about 10% resistance change ratio (resistance increase) is resulted by conducting a heat treatment in the interconnection step. On the contrary, in the resistor according to the first embodiment, the resistance change ratio after conducting the heat treatment in the interconnection step depends on the thickness of the second resistor layer, in which the resistance change ratio decreases as the thickness of the second resistor layer increases and a substantially constant resistance change ratio of about 1% or less is obtained at a thickness of 5 nm or more. Accordingly, in a case where the thickness of the second resistor layer is at least 5 nm, the resistance change ratio can be suppressed to a fluctuation width within 1% which is suitable to practical use.

Further, when the change ratio of the temperature coefficient of resistance during interconnection step is determined for the existent resistor and the resistor R1 according to the first embodiment having 5 nm thickness for the second resistor layer, while the temperature coefficient of resistance increased from 80 ppm/° C. to 110 ppm/° C. in a case of the existent resistor, increase of the temperature coefficient of resistance remained in a range of slight increase from 20 ppm/° C. to 22 ppm/° C. in a case of the resistor R1 of the first embodiment.

Further, the composition of the tantalum nitride film constituting the first and the second resistor layers 5a, 5b of the resistor R1 according to the first embodiment was examined by a transmission electron microscope (TEM) having a function of energy dispersion X-ray fluorescence analysis (EDX). As a result, the concentration of nitrogen in the tantalum nitride film constituting the first resistor layer 5a was less than 30 at % (typical concentration of nitrogen: 20 at %), which showed a substantial constant composition in the direction of the film thickness. On the other hand, it was found that the concentration of nitrogen of the tantalum nitride film constituting the second resistor layer 5b was 30 at % or more (typical concentration of nitrogen: 30 at %).

Further, the crystal structure of the tantalum nitride film constituting the first and the second resistor layers 5a, 5b of the resistor R1 according to the first embodiment was examined by using TEM. As a result, it was confirmed that the tantalum nitride film constituting the first resistor layer 5a comprises a $Ta_2N$ crystal phase as a main constituent phase and the tantalum nitride film constituting the second resistor layer 5b has a mixed phase composed of an amorphous phase and a TaN crystal phase as a main constituent phase.

The difference of the crystal structure in the tantalum nitride film due to the difference of the nitrogen flow rate was obtained also from the result of X-ray diffractiometry for the single tantalum nitride layer film. FIG. 11 shows the result of X-ray diffractiometry for the tantalum nitride films formed by the sputtering method while varying the nitrogen flow rate. As shown in FIG. 11, the observed diffraction peaks depend on the nitrogen flow rate. It can be seen that while the diffraction peak for $Ta_2N$ is intense at a nitrogen flow rate of 20 sccm, the diffraction peak for TaN is intense at a nitrogen flow rate of 60 sccm and the phase changes from $Ta_2N$ to TaN as the nitrogen flow rate increases.

In the first embodiment, the resistor R1 composed of two resistor layers of the first resistor layer 5a and the second resistor layer 5b is described. However, since the first resistor layer 5a and the second resistor layer 5b are formed continuously in one identical deposition chamber, even when the nitrogen flow rate is changed from 20 sccm to 100 sccm, a boundary between both of them is not distinct and the boundary has a slope for the concentration of nitrogen within a range of the thickness for about 2 nm. Accordingly, the first resistor layer 5a and the second resistor layer 5b can be considered also as a single resistor layer having two regions of different concentration of nitrogen. In this case, the second resistor layer 5b situated on the side opposite to the substrate 1 corresponds to an upper region of the resistor R1 with the concentration of nitrogen of 30 at % or more and the thickness of 5 nm.

As described above, according to the first embodiment, since the tantalum nitride film using nitrogen and tantalum as main constituent elements is used as the material for the resistor, the resistor R1 can be formed to the layer above the interconnection composed of the metal film and the resistor R1 can be disposed more remote from the substrate 1 than the interconnection, so that the parasitic capacitance between the substrate 1 and the resistor R1 can be decreased. Further, when the tantalum nitride film is formed by the sputtering method, in a case of increasing the ratio of the nitrogen gas contained in the sputtering gas, thereby increasing the concentration of nitrogen in the tantalum nitride film in the upper region of the resistor R1 (second resistor layer 5b), for example, to 30 at % or more and by forming the tantalum nitride film in the region as a mixed phase of amorphous and TaN crystals, change ratio of resistance of the resistor R1 can be suppressed to less than 1% even when thermal load exerts during interconnection step.

In the first embodiment, while a tantalum nitride film formed by a reactive DC sputtering method at an argon flow rate of 30 sccm, a nitrogen flow rage of 20 sccm, and a target power of 12 kW was used as a first resistor layer 5a, they are not restrictive. So long as a small temperature coefficient of resistance is obtained as shown in FIG. 4, the argon flow rate, the nitrogen flow rate, and the target voltage can be controlled optionally. Further, while the DC sputtering method was used in the first embodiment, a high frequency (RF) sputtering method may also be used.

In the first embodiment, while a tantalum nitride film formed by a reactive DC sputtering method at an argon flow rate of 30 sccm, a nitrogen flow rage of 100 sccm and a target power of 12 kW was used as a second resistor layer 5b, they are not restrictive. So long as high resistivity (for example, about 10 times as high as the resistivity of the tantalum nitride film constituting the first resistor layer 5a, as a target) is obtained as shown in FIG. 4, the argon flow rate, and the nitrogen flow rate, the target voltage can be controlled optionally. Further, while the DC sputtering method was used in the first embodiment, a high frequency (RF) sputtering method may also be used.

Further, in the first embodiment, while the first and the second resistor layers 5a, 5b were formed while maintaining the target power in one identical deposition chamber, this is not restrictive. It is possible to form the first resistor layer 5a and the second resistor layer 5b in separate deposition chambers or interrupt sputtering discharge once during film formation.

Further, in the first embodiment, while the tantalum nitride film of 20 nm thickness was used as the first resistor layer 5a and the tantalum nitride film of 5 nm thickness was used as the second resistor layer 5b, the thickness for the first and the second resistor layers 5a, 5b is not restricted to the same. The thickness of the first resistor layer 5a can be determined based on the sheet resistance of the resistor layer and the resistivity of the tantalum nitride film required in view of the circuit design. The thickness of the second resistor layer 5b can be determined based on the allowable resistance change ratio. As shown in FIG. 10, by using a tantalum nitride film of about 5 nm thickness (formed at a nitrogen flow rate of 100 sccm) as the second resistor layer 5b, while the resistance change ratio can be suppressed within 1%, it is possible to decrease the thickness of the second resistor layer 5b as thin as less than 5 nm when the requirement for the resistance change is moderate. On the other hand, in a case where a heat treatment at high temperature for long time is applied or in a case where it is intended to take a sufficient margin for the resistance change, it is possible to increase the thickness of the second resistor layer 5b as large as 5 nm or more. However, since the tantalum nitride film formed at a nitrogen flow rate of 100 sccm has high resistivity, and the connection resistance between the second plug 10b and the second resistor layer 5b increases as the thickness of the tantalum nitride film increases, it is considered that a range, for example, from 5 to 10 nm is appropriate.

Further, in the first embodiment, as shown in FIG. 9, while the second interconnection M2b, the second plug 10b, the first and the second resistor layers 5a, 5b, the third plug 10c and the second interconnection M2c are disposed in one identical direction they are not restricted to such arrangement. The shape for the first and the second resistor layers 5a, 5b, the position and the quantity of the second and the third plugs 10b, 10c, and the shape, leading direction, etc. of the second interconnections M2b, M2c can be changed optionally.

Further, in the first embodiment, while the silicon nitride film of 100 nm thickness formed by using the plasma CVD method was used as the first hard mask 6, the thickness and the material are not restricted to them. Other materials can also be used so long as they are not electroconductive and highly resistant to etching, and the deposition step is aligned with the interconnection step. For example, a silicon carbide film, a nitrogen-containing silicon carbide film, an aluminum nitride film, etc. may also be used. Further, the thickness of the first hard mask 6 can be changed in accordance with the thickness of the second resistor layer 5b, the selectivity upon etching, etc.

Further, in the first embodiment, while the aluminum alloy films 3, and 11 having the titanium nitride films 3d, 3u, and 11d, 11u that function as the barrier metal as upper and lower layers are used as first interconnection M1 and the second interconnection M2a, M2b, M2c, they are not restricted. Instead of the aluminum alloy film 3, 11, a tungsten film or the like can also be used. Further, instead of the titanium nitride films 3d, 3u, and 11d, 11u, a tantalum film, a tungsten film and a metal film composed of a nitride thereof as the main ingredient can also be used and an interconnection structure not using the barrier metal can also be utilized when there is a margin in view of the reliability.

Further, in the first embodiment, while the first and the second plugs 10a, 10b are formed by filling the tungsten film formed by the CVD method in the first and the second connection holes 9a, 9b and polishing them by the CMP method, other methods can also be used.

Second Embodiment

Figure 12:
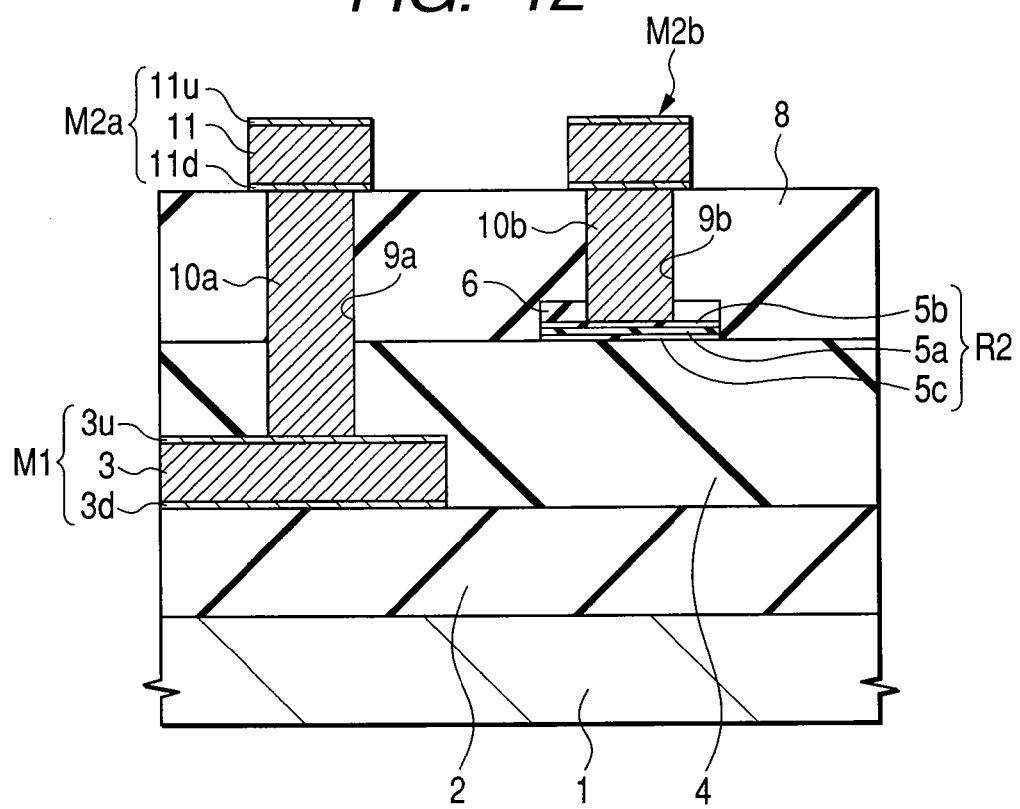
FIG. 12 is a cross sectional view for a main portion showing a method of manufacturing a resistor according to a second embodiment of the invention.

A resistor R2 according to a second embodiment of the invention is constituted with a tantalum nitride film in the same manner as the resistor R1 according to the first embodiment described above. However, the resistor R2 is different from the resistor R1 of the first embodiment described above for the concentration of nitrogen contained in the tantalum nitride film and this is a resistor in which the concentration of nitrogen in the upper region situated on the side opposite to the substrate and in the lower region on the side of the substrate is higher than the concentration of nitrogen in the middle region. The resistor R2 according to the second embodiment is to be described with reference to the cross sectional view for the main portion of the resistor R2 shown in FIG. 12. Since the structure and the manufacturing process other than those for the tantalum nitride film constituting the resistor R2 are identical with those of the first embodiment described above, descriptions therefor are to be omitted.

A tantalum nitride film constituting the resistor R2 according to the second embodiment is formed by reactive DC sputtering method using tantalum as the sputtering target material, using a gas mixture of argon and nitrogen as a sputtering gas by depositing a third resistor layer composed of a tantalum nitride film (corresponding to the lower region) 5c, a first resistor layer composed of a tantalum nitride film (corresponding to the middle region) 5a and second a resistor layer composed of a tantalum nitride film (corresponding to the upper region) successively. The thickness of the tantalum nitride film constituting the first resistor layer 5a is, for example, 20 nm, and the thickness for each of the tantalum nitride films constituting the second resistor layer 55b situated to the upper layer and the third resistor layer 5c situated to the lower layer is, for example, 5 nm.

The sputtering sequence for forming the third, and the first and the second resistor layers 5c, 5a, and 5b is as described below. At first, the third resistor layer 5c is formed by fixing the argon flow rate during sputtering, for example, to 30 sccm and keeping the nitrogen flow rate, for example, to 100 sccm for 5 sec, the first resistor layer 5a is formed by keeping the nitrogen flow rate, for example, to 20 sccm for 17 sec and then the second resistor layer 5b is formed by keeping the nitrogen flow rate, for example, to 100 sccm for 5 sec. The charged power to the target is set at a predetermined value, for example, of 12 kW.

In the thus formed resistor R2, since the tantalum nitride films each at a concentration of nitrogen of 30 at % or more and having a mixed phase composed of an amorphous phase and a TaN crystal phase as a main constituent phase is formed in the upper region and the lower region, resistance fluctuation due to oxidation of the resistor R2 can be suppressed even in a case where the moisture permeability of the second interlayer dielectric film 4 just below the resistor R2 is high and the lower surface of the resistor R2 tends to be oxidized, in addition to the effect of the first embodiment described above.

Third Embodiment

Figure 13:
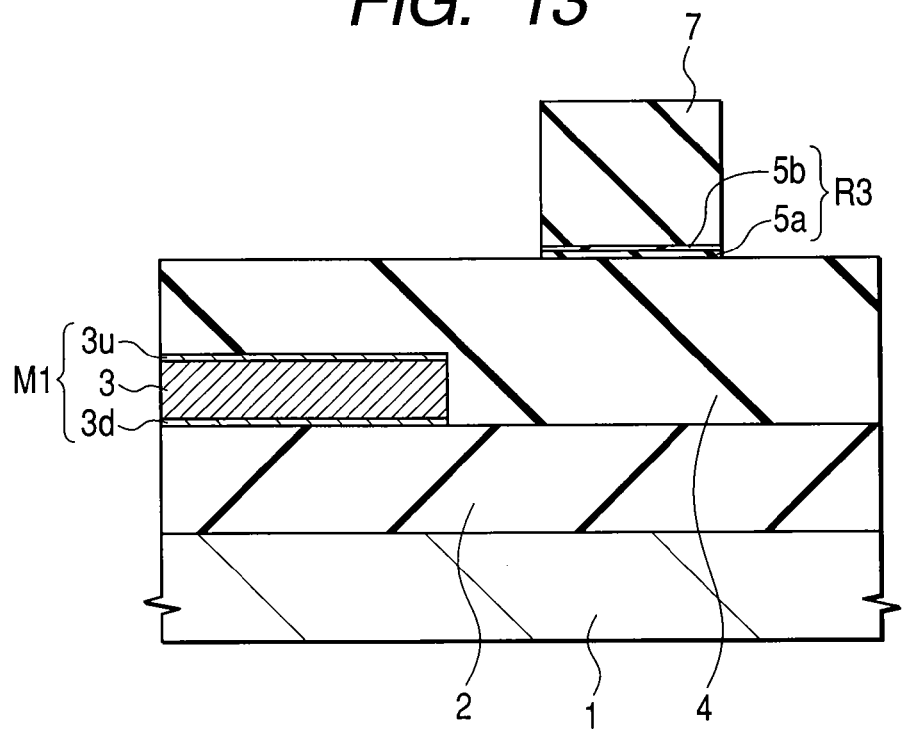
FIG. 13 is a cross sectional view for a main portion showing a method of manufacturing a resistor according to a third embodiment of the invention.

The resistor R3 according to the third embodiment of the invention is formed of a tantalum nitride film in the same manner as the resistor R1 according to the first embodiment described above. However, in the resistor R3, the fabrication method for the first and the second resistor layers 5a, 5b deposited above the second interlayer dielectric film 4 is different from the fabrication method for the first embodiment described above, and the first and the second resistor layers 5a, 5b are fabricated by using a first resist pattern 7 as a mask not using the first hard mask 6. A method of manufacturing the resistor R3 according to the third embodiment is to be described with reference to the cross sectional view for a main portion of the resister R3 shown in FIG. 13. Since the structure and the manufacturing process other than those for the tantalum nitride film constituting the resistor R3 are identical with those in the first embodiment described above, explanations therefor are to be omitted.

At first, the first resistor layer 5a and the second resistor layer 5b are deposited successively above the second interlayer dielectric film 4 in the same manner as in the first embodiment. Then, a first resist pattern 7 formed of a photosensitive organic film is formed to a desired region on the second resistor layer 5b by using a photolithographic method, and the second resistor layer 5b and the first resistor layer 5a are fabricated successively by a dry etching method using the first resist pattern 7 as a mask to form the resister R3 composed of the first and the second resistor layers 5a, 5b.

The resistor R3 formed as described above can provide the same effect as that of the first embodiment described above. Further, upon fabrication of the first and the second resistor layers 5a, 5b, since they are fabricated by using the first resist pattern 7 as a mask without using the first hard mask 6 used in the first embodiment described above, the number of steps can be decreased and the dimensional control upon fine fabrication can be facilitated. Upon removal of the first resist pattern 7, while the surface of the second resist layer 5b just below the first resist pattern 7 is oxidized by about several nm by an oxidative gas contained in an atmosphere, since the resistance of the second resistor layer 5b is inherently higher compared with that of the first resistor layer 5a, fluctuation of the resistance due to oxidation upon removal of the first resist pattern 7 can be suppressed.

Fourth Embodiment

A resistor R4 according to a fourth embodiment of the invention is formed of a tantalum nitride film in the same manner as the resistor R1 according to the first embodiment described above. However, in the resistor R4, the take-out electrode is different from the take-out electrode in the first embodiment in which the take-out electrode is disposed to the lower surface of the resistor R4. A method of manufacturing the resistor R4 according to the fourth embodiment is to be described with reference to the cross sectional view for a main portion of the resistor R4 shown in FIG. 14 to FIG. 18.

Figure 14:
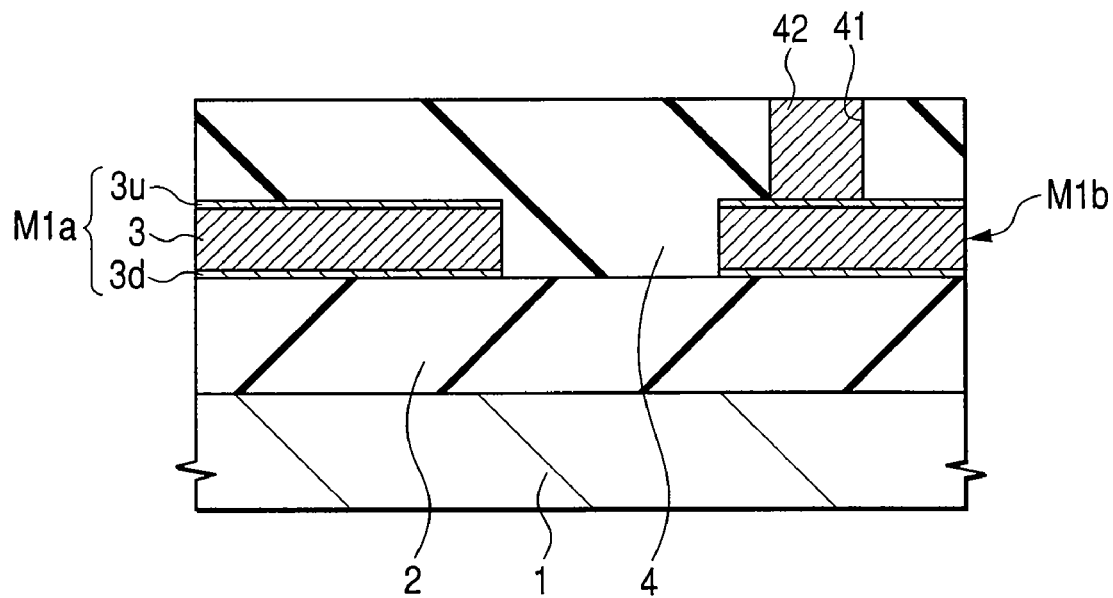
FIG. 14 is a cross sectional view for a main portion showing a method of manufacturing a resistor according to a fourth embodiment of the invention.

At first, as shown in FIG. 14, in the same manner as the first embodiment described above, a first interlayer dielectric film 2 composed of a silicon oxide film is formed on the main surface of the substrate 1, first interconnections M1a, M1b composed of titanium nitride films 3b, 3u and an aluminum alloy film 3 are formed and, successively, a second interlayer dielectric film 4 composed of a silicon oxide film covering the first interconnections M1a, M1b is formed.

Then, by a photolithographic method and a dry etching method, the second interlayer dielectric film 4 is fabricated to form a fourth connection hole 41 so as to expose a portion of the surface of the first interconnection M1b. Successively, after forming a metal film, for example, a tungsten film by a sputtering method and a CVD method above the main surface of the substrate 1, the metal film is polished by a CMP method to form a fourth plug 42 to the inside of the fourth connection hole 41.

Figure 15:
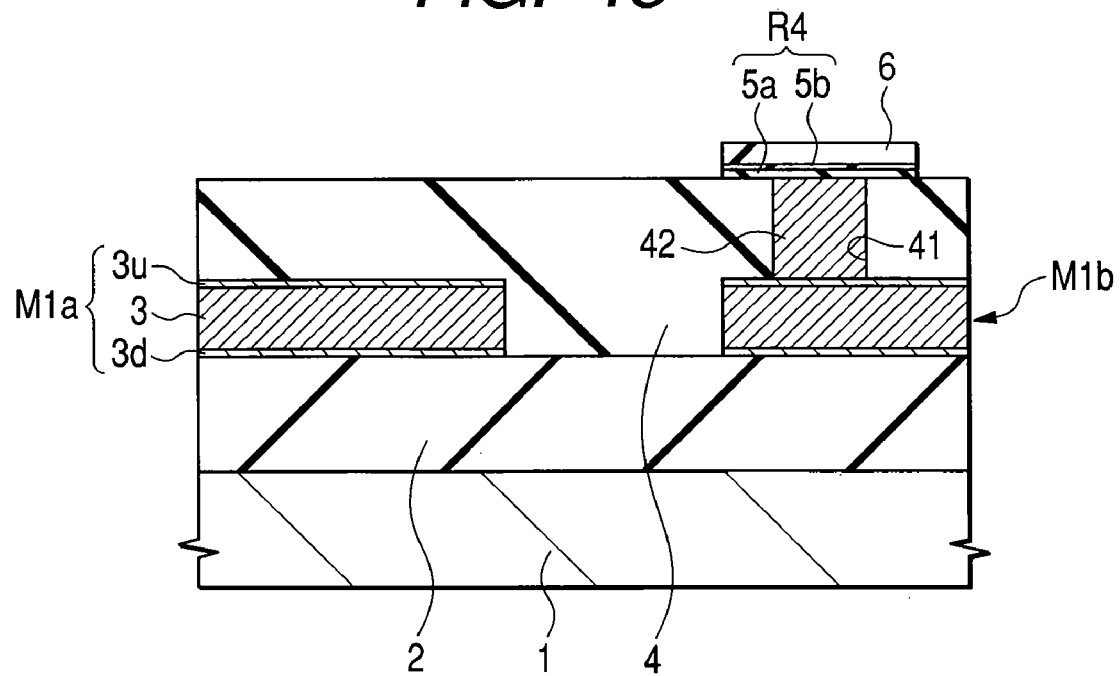
FIG. 15 is a cross sectional view for a main portion of a part identical with that in FIG. 14 during a manufacturing step of the resistor succeeding to FIG. 14.

Then, as shown in FIG. 15, in the same manner as the first embodiment described above, a first resistor layer 5a composed of a tantalum nitride film, and a second resistor layer 5b composed of a tantalum nitride film are formed successively and, further, a first dielectric film 6a composed of a silicon nitride film is formed. Successively, the first dielectric film 6a is fabricated by a dry etching method using a first resist pattern 7 formed by using a photolithographic method as a mask to form a first hard mask 6. Successively, after removing the first resist pattern 7, the second resistor layer 5b and the first resistor layer 5a are successively fabricated by a dry etching method using the first hard mask 6 as a mask to form the resistor R4 composed of the first and the second resistor layers 5a, 5b.

Figure 16:
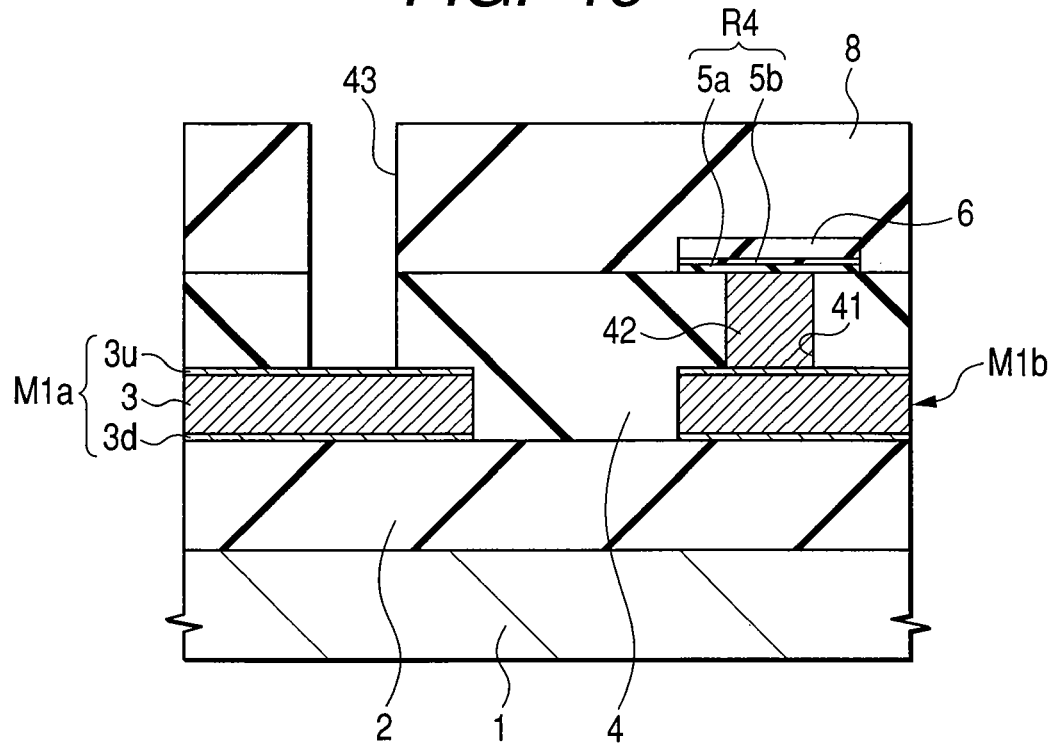
FIG. 16 is a cross sectional view for a main portion of a part identical with that in FIG. 14 during a manufacturing step of the resistor succeeding to FIG. 15.

Then, as shown in FIG. 16, after forming a third interlayer dielectric film 8 composed of a silicon oxide film above the main surface of the substrate 1, the third interlayer dielectric film 8 is fabricated by a photolithographic method and a dry etching method to form a fifth connection hole 43 so as to expose a portion of the surface of the first interconnection M1a.

Figure 17:
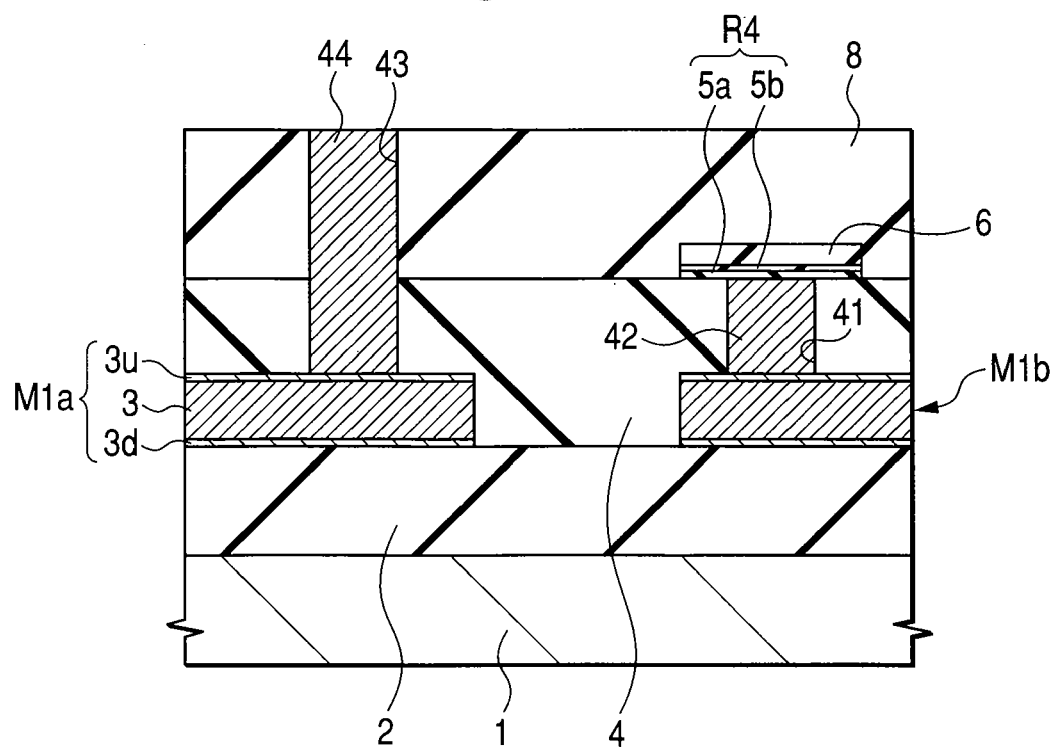
FIG. 17 is a cross sectional view for a main portion of a part identical with that in FIG. 14 during a manufacturing step of the resistor succeeding to FIG. 16.

Then, as shown in FIG. 17, after forming a metal film, for example, a tungsten film by a sputtering method and a CVD method above the main surface of the substrate 1, the metal film is polished by a CMP method to form a fifth plug 44 to the inside of the fifth connection pole 43.

Figure 18:
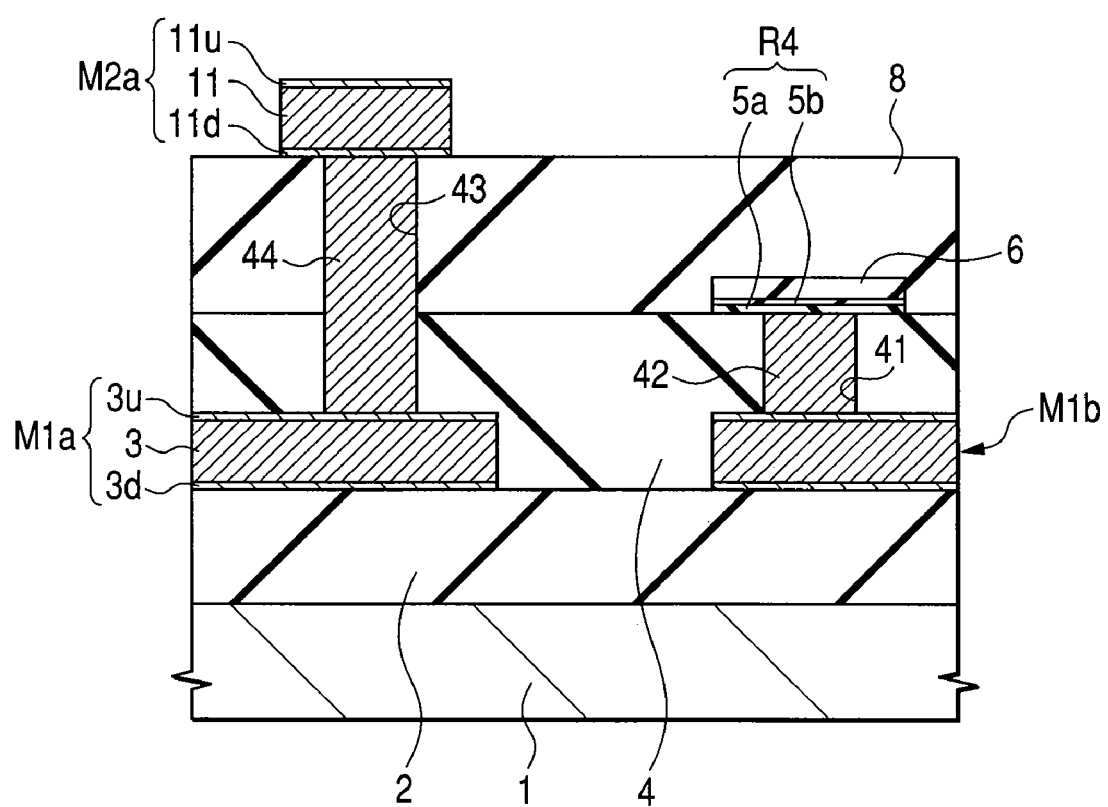
FIG. 18 is a cross sectional view for a main portion of a part identical with that in FIG. 14 during a manufacturing step of the resistor succeeding to FIG. 17.

Then, as shown in FIG. 18, after forming a titanium nitride film 11d, an aluminum alloy film 11, and a titanium nitride film 11u successively by a sputtering method above the main surface of the substrate 1, the multi-level film is fabricated by a photolithographic method and a dry etching method to form a second interconnection M2a for electrically connecting with the fifth plug 44.

Figure 19:
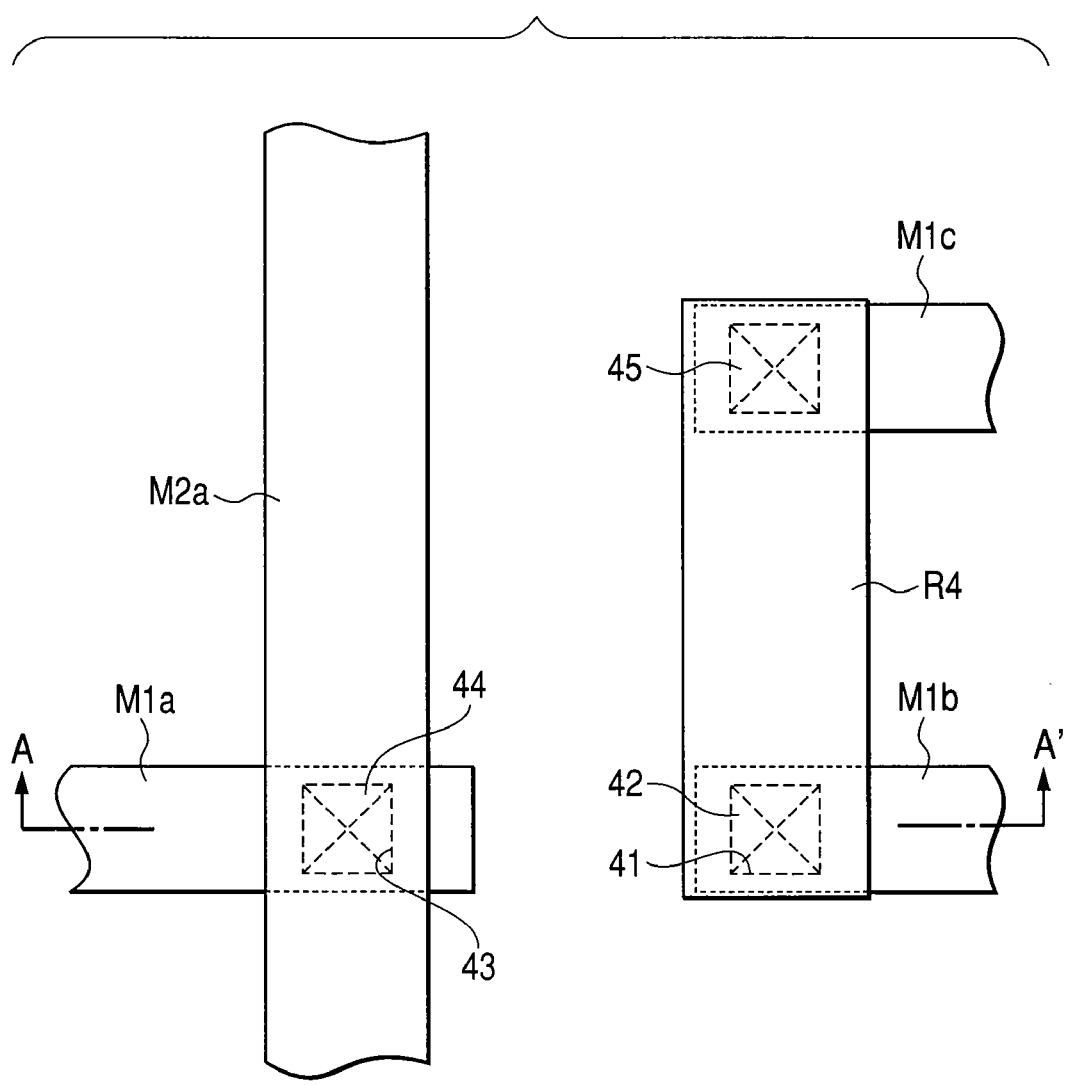
FIG. 19 is a planar layout view of the resistor according to a fourth embodiment of the invention.

FIG. 19 shows a planar layout view of the resistor R4. Cross sectional views shown in FIG. 14 to FIG. 18 show cross sections along line A-A' in FIG. 19.

As shown in FIG. 19, a lead electrode composed of a second plug 42 formed in contact with the first resistor layer 5a and the first interconnection M1b is formed to one end of the resistor R4, while a lead electrode composed of a sixth plug 45 formed in contact with the first resistor layer 5a and the first interconnection M1c is formed at the other end of the resistor R4. The sixth plug 45 is a plug formed in the same manner as the fourth plug 42, and the first interconnection M1c is an interconnection formed in the same manner as the first interconnection M1b. Further, in adjacent with the resistor R4, an interconnection constituted with the first interconnection M1a, the fifth plug 44, and the second interconnection M2a is laid.

In the same manner as the third embodiment described above, when the first and the second resistor layers 5a, 5b are fabricated, they may be fabricated using the first resist pattern 7 as a mask without using the first hard mask 6.

The thus formed resistor R4 can provide the same effect as the first embodiment described above. Further, since the distance between the substrate 1 and the resistor R4 is made relatively longer by providing the take-out electrode of the resistor R4 to the lower surface of the resistor R4, the parasitic capacitance of the resistor R4 is decreased, for example, to less than that of the resistor R1 according to the first embodiment and this is suitable in view of the high frequency characteristic.

Fifth Embodiment

A resistor R5 according to a fifth embodiment of the invention is formed of a tantalum nitride film in the same manner as the resistor R1 according to the first embodiment described above. However, the method of forming the first interconnection M1 and the second interconnections M2a, M2b is different from the formation method in the first embodiment described above in which the first interconnection M1 and the second interconnections M2a, M2b are formed by a damascene method. A method of manufacturing the resistor R5 according to the fifth embodiment is to be described with reference to the cross sectional view for a main portion of the resistor R5 shown in FIG. 20 to FIG. 22.

Figure 20:
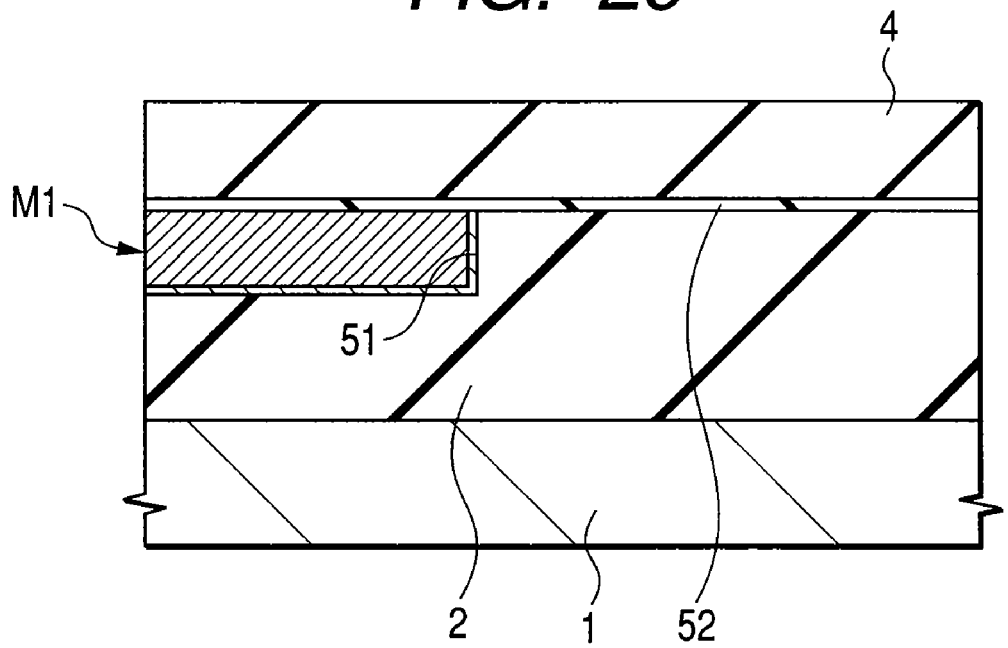
FIG. 20 is a cross sectional view for a main portion showing a method of manufacturing a resistor according to a fifth embodiment of the invention.

At first, as shown in FIG. 20, in the same manner as in the first embodiment described above, after forming a first interlayer dielectric film 2 composed of a silicon oxide film on the main surface of a substrate 1, a first interconnection M1 is formed by a single damascene method. The first interconnection M1 is formed, for example, by the manufacturing process described below. At first, an interconnection trench 51 at a depth, for example, of 500 nm is formed in a predetermined region of the first interlayer dielectric film 2. Successively, after forming, for example, a tantalum nitride film of 50 nm thickness and a copper film of 100 nm thickness by a sputtering method above the main surface of the substrate 1, a copper film at a thickness, for example, of 600 nm is deposited by an electroplating method using a solution composed of a copper sulfate solution as a main ingredient. Then, by polishing the copper film and the tantalum nitride film by a CMP method, the copper film and the tantalum nitride film are buried in the inside of the interconnection trench 51 to form a first interconnection M1.

Then, a silicon nitride film 52 and a second interlayer dielectric film 4 composed of a silicon oxide film are formed by a plasma CVD method. The silicon nitride film 52 functions as a stopper film for etching upon subsequently forming a connection hole to be connected with the first interconnection M1.

Figure 21:
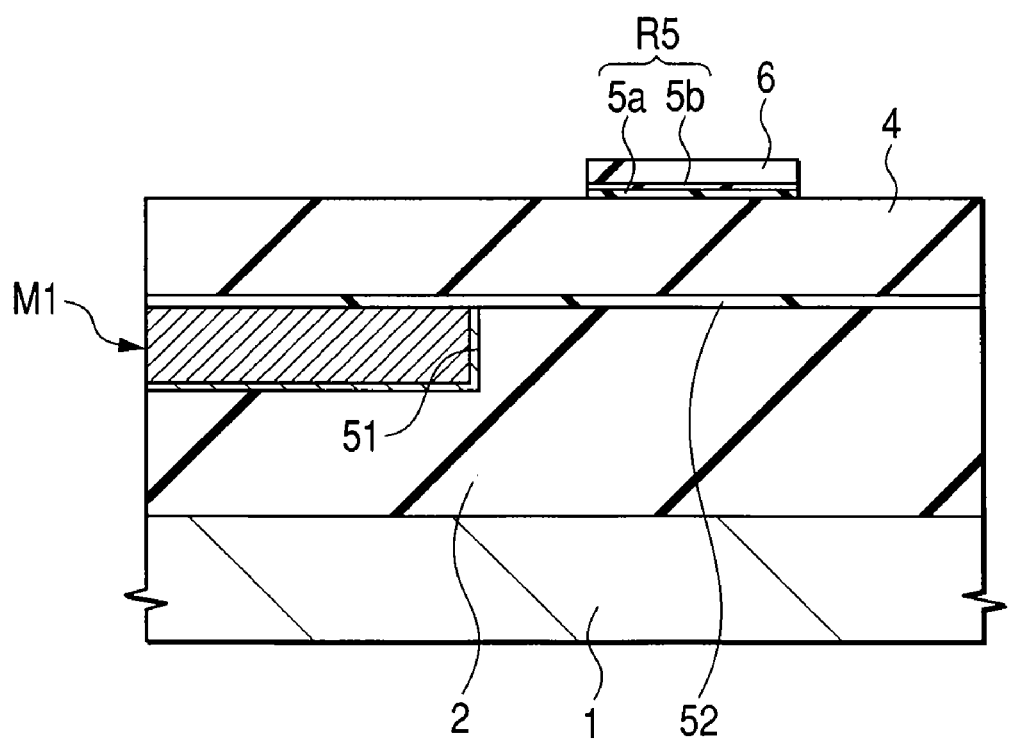
FIG. 21 is a cross sectional view for a main portion of a part identical with that in FIG. 20 during a manufacturing step of the resistor succeeding to FIG. 20.

Then, as shown in FIG. 21, a first resistor layer 5a composed of a tantalum nitride film and a second resistor layer 5b composed of a tantalum nitride film are formed successively in the same manner as the first embodiment described above and, further, a first dielectric film 6a composed of a silicon nitride film is formed. Successively, the first dielectric film 6a is fabricated by a dry etching method using a first resist pattern 7 formed by using a photolithographic method as a mask to form a first hard mask 6. Successively, after removing the first resist pattern 7, the second resistor layer 5b and the first resistor layer 5a are fabricated successively by a dry etching method using the first hard mask 6 as a mask to form a resistor R5 composed of the first and the second resistor layers 5a, 5b.

Figure 22:
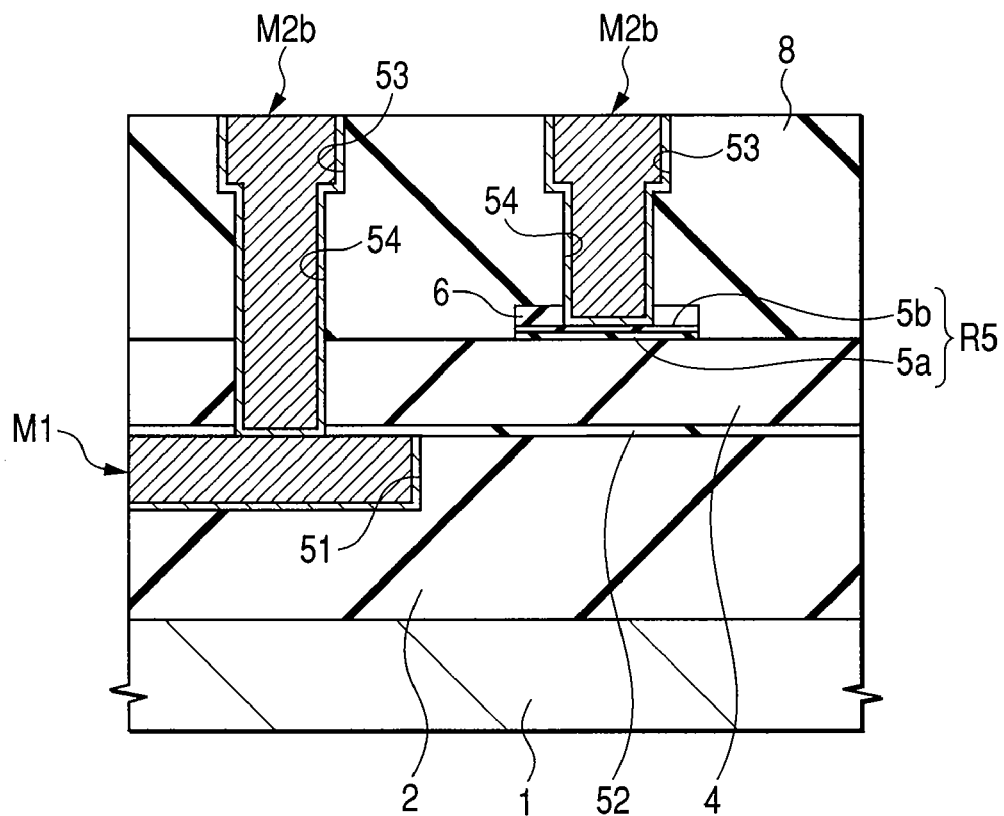
FIG. 22 is a cross sectional view for a main portion of a part identical with that in FIG. 20 during a manufacturing step of the resistor succeeding to FIG. 21.

Then, as shown in FIG. 22, a third interlayer dielectric film 8 composed of a silicon oxide film is formed above the main surface of the substrate 1. The silicon oxide film is formed, for example, by a plasma CVD method and the thickness thereof is 1.5 µm. Then, second interconnections M2a, M2b are formed by a dual damascene method. The second interconnections M2a, M2b are formed, for example, by the following manufacturing process. At first, after forming a resist pattern for fabrication of an interconnection trench over the third interlayer dielectric film 8 by a photolithographic method, an interconnection trench 53, for example, of 500 nm depth is formed in a predetermined region of the third interlayer dielectric film 8 by a dry etching method using the resist pattern for fabrication of the interconnection trench as a mask. Successively, after removing the resist pattern for fabrication of the interconnection trench and forming a resist pattern for fabrication of a connection hole over the third interlayer dielectric film 8 by a photolithographic method, a connection hole 54 in contact with the first interconnection M1 or the second resistor layer 5b is formed to the second and the third interlayer dielectric films 4, 8 by a dry etching method using the resist pattern for fabrication of the connection hole as a mask. In this case, the first hard mask 6 and the silicon nitride film 52 function as a stopper film for etching. Successively, the first hard mask 6 and the silicon nitride film 52 at the bottoms of the connection holes 54 are removed.

Then, after forming, for example, a tantalum nitride film of 50 nm thickness and a copper film of 100 nm thickness by a sputtering method above the main surface of the substrate 1, a copper film, for example, of 600 nm thickness is deposited by an electroplating method using a solution composed of a copper sulfate solution as a main ingredient. Then, by polishing the copper film and the tantalum nitride film by a CMP method, the copper film and the tantalum nitride film are buried in the inside of the interconnection trench 53 and the connection hole 54 to form the second interconnections M2a, M2b.

In the same manner as in the second embodiment described above, a tantalum nitride film at a concentration of nitrogen of 30 at % or more and having a mixed phase composed of an amorphous and a TaN crystal phase as a main constituent phase may be formed in the upper region and the lower region of the resistor R5. Further, in the same manner as in the third embodiment described above, the first and the second resistor layers 5a, 5b may be fabricated by using the first resist pattern 7 as a mask without using the first hard mask 6.

The resistor R5 formed as described above can provide the same effect as the first embodiment described above. Further, since copper is used as the interconnection material for the first interconnection M1 and the second interconnections M2a, M2b, the parasitic resistance of the first interconnection M1 and the second interconnections M2a, M2b can be decreased in which the parasitic ingredient of the resistor R5 is decreased, for example, to less than that of the resistor R1 of the first embodiment described above and this is suitable in view of high frequency characteristic.

Sixth Embodiment

A resistor R6 according to a sixth embodiment of the invention is formed of a tantalum nitride film in the same manner as the resistor R1 according to the first embodiment described above. However, the method of introducing nitrogen into the upper region of the resistor R6 is different from the method of introducing nitrogen in the first embodiment described above. A method of manufacturing the resistor R6 according to the sixth embodiment is to be described with reference to the cross sectional view for a main portion of the resistor R6 shown in FIG. 23 and FIG. 24. Since the structure, the manufacturing process, etc. other than those for the tantalum nitride film constituting the resistor R6 are identical with those in the first embodiment described above, descriptions therefor are to be omitted.

Figure 23:
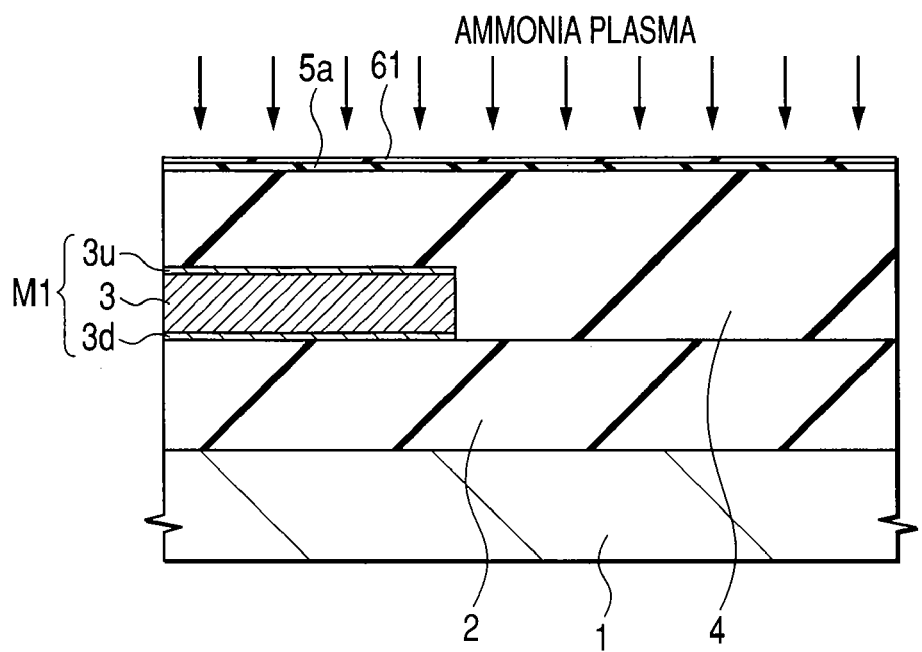
FIG. 23 is a cross sectional view for a main portion showing a method of manufacturing a resistor according to a sixth embodiment of the invention.

At first, in the same manner as the first embodiment described above, a first resist layer 5a is deposited on the second interlayer dielectric film 4. Then, as shown in FIG. 23, a plasma nitridation layer 61 is formed to the surface of the first resistor layer 5a by an inductively coupled plasma (ICP) method. By introducing a gas mixture containing an ammonia gas into an ICP chamber and plasma-nitriding the surface of the first resistor layer 5a, an amorphous plasma nitridation layer 61 with a concentration of nitrogen of 30 at % or more is formed. The thickness of the plasma nitridation layer 61 is, for example, 10 nm. Further a silicon nitride film situating below the plasma nitridation layer 61 and constituting the first resistor layer 5a is at a concentration of nitrogen of 22% and has a crystal phase of $Ta_2N$ crystals, and there was observed no effect of the inductively coupled plasma method on the concentration of nitrogen and the crystal phase of the silicon nitride film constituting the first resistor layer 5a.

Figure 24:
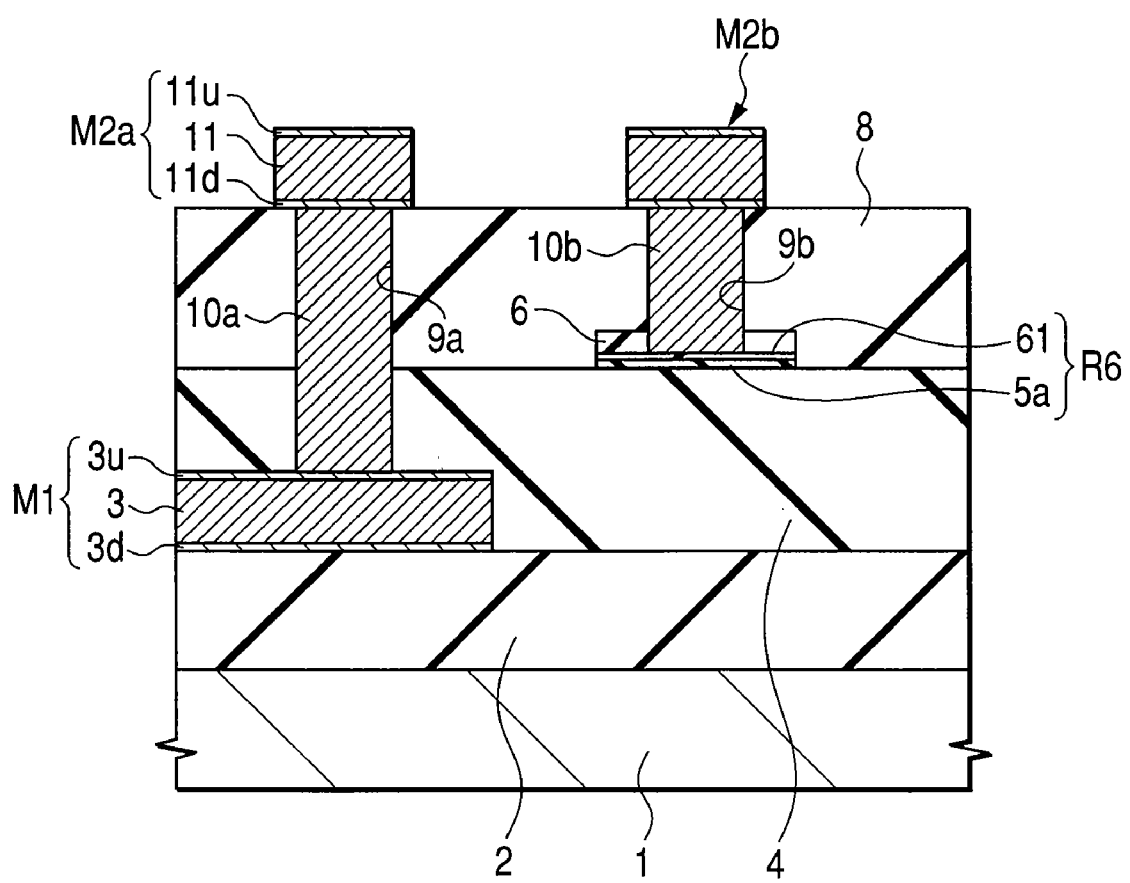
FIG. 24 is a cross sectional view for a main portion of a part identical with that in FIG. 23 during a manufacturing step of the resistor succeeding to FIG. 23.

Then, as shown in FIG. 24, in the same manner as in the first embodiment described previously, a first dielectric film 6a is formed on the plasma nitrided layer 61, and the first dielectric film 6a is fabricated by using the first resist pattern 7 as a mask to form a first hard mask 6. Successively, after removing the first resist pattern 7, the plasma nitrided layer 61 and the first resistor layer 5a are successively fabricated by a dry etching method using the first hard mask 6 as a mask to form a resistor R6 composed of the plasma nitrided layer 61 and the first resistor layer 5a.

While plasma nitridation is conducted to the upper region of the tantalum nitride film by using the ammonia gas, the gas to be used and the nitridation method are not restricted to them so long as nitrogen is introduced to the upper region of the first resistor layer 5a by exposing the surface of the first resistor layer 5a to an atmosphere containing nitrogen atoms. For example, atomic nitrogen (nitrogen radicals) may also be used. Further, the nitridation thickness is not restricted to 10 nm but can be controlled in accordance, for example, with a required resistance change ratio.

The resistor R6 formed as described above can provide the same effect as in the first embodiment described above. Further, by plasma nitridation of the tantalum nitride film, a resistor R6 at a concentration of nitrogen of 30 at % or more and having an amorphous upper region can be formed easily.

While the invention made by the present inventor has been described specifically based on preferred embodiments thereof, the invention is not restricted to such preferred embodiments but they can be modified variously in a range without department the gist of the invention.

The present invention is applicable to resistors composed of metal films formed above a main surface of a substrate included in a semiconductor device.

What is claimed is:

1. A semiconductor device comprising:
   a resistor composed of nitrogen and tantalum as main constituent elements above the main surface of a substrate,
   wherein the concentration of nitrogen in the upper region of the resistor situated on the side opposite to the substrate is 30 at % or more, and
   wherein the concentration of nitrogen in the lower region of the resistor situated on the side of the substrate is 30 at % or more.

2. A semiconductor device according to claim 1, wherein the thickness of the lower region of the resistor is from 5 to 10 nm.

3. A semiconductor device according to claim 1, wherein a region at a concentration of nitrogen of less than 30% is included in a region other than the upper region and the lower region of the resistor.

4. A semiconductor device according to claim 1, wherein the lower region of the resistor has an amorphous phase and a TaN crystal phase as a main constituent phase.

5. A semiconductor device according to claim 1, wherein the take-out electrode of the resistor is constituted by plugs connecting to two positions at the lower surface of the resistor and interconnections situated to a layer below the resistor and connected with the plugs respectively.

* * * * *